(12) United States Patent
Sekihara

(10) Patent No.: US 9,740,093 B2
(45) Date of Patent: Aug. 22, 2017

(54) PELLICLE

(71) Applicant: SHIN-ETSU CHEMICAL CO., LTD., Tokyo (JP)

(72) Inventor: Kazutoshi Sekihara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 91 days.

(21) Appl. No.: 14/971,268

(22) Filed: Dec. 16, 2015

(65) Prior Publication Data

US 2016/0187772 A1 Jun. 30, 2016

(30) Foreign Application Priority Data

Dec. 25, 2014 (JP) .................................. 2014-261769

(51) Int. Cl.
*G03F 1/64* (2012.01)
*G03F 1/62* (2012.01)

(52) U.S. Cl.
CPC . *G03F 1/64* (2013.01); *G03F 1/62* (2013.01)

(58) Field of Classification Search
CPC ..................................... G03F 1/62; G03F 1/64
USPC ........................................................... 430/5
See application file for complete search history.

(56) References Cited

U.S. PATENT DOCUMENTS

| 2009/0286169 A1 | 11/2009 | Shirasaki |
| 2010/0328641 A1 | 12/2010 | Shirasaki et al. |
| 2010/0330466 A1 | 12/2010 | Shirasaki et al. |
| 2010/0330467 A1 | 12/2010 | Shirasaki et al. |
| 2011/0236807 A1 | 9/2011 | Shirasaki |

FOREIGN PATENT DOCUMENTS

| JP | 2011-7933 A | 1/2011 |
| JP | 2011-7934 A | 1/2011 |
| JP | 2011-7935 A | 1/2011 |
| TW | 200947115 A | 11/2009 |
| TW | 201214023 A | 4/2012 |
| TW | 201350554 A | 12/2013 |
| TW | 201400978 A | 1/2014 |

OTHER PUBLICATIONS

Office Action dated Oct. 24, 2016, issued in counterpart Taiwanese Patent Application No. 104142582. (6 pages).

*Primary Examiner* — Christopher Young
(74) *Attorney, Agent, or Firm* — Westerman, Hattori, Daniels & Adrian, LLP

(57) ABSTRACT

A pellicle is proposed in which a mask-bonding agglutinant layer, that bonds the pellicle to a photomask, is divided into segments, and the vacancies thus created between these segments are entirely occupied by segments of a non-resilient body layer, and these alternately arranged segments are flush with each other.

13 Claims, 1 Drawing Sheet

PELLICLE

The present non-provisional patent application claims priority, as per Paris Convention, from Japanese Patent Application No. 2014-261769 filed on Dec. 25, 2014, the disclosure of which is hereby incorporated by reference herein in its entirety.

FIELD OF THE INVENTION

The Present Invention Relates to a Pellicle Useful as a Dust-Fender employed in the scenes of manufacturing semiconductor devices, IC packages, printed circuit boards, liquid crystal display panels, organic EL display panels, etc.

BACKGROUND TECHNOLOGY

In manufacturing semiconductor devices such as LSI and super-LSI or in manufacturing a liquid crystal display panel or the like, a pattern is made by irradiating a ultraviolet light to a semiconductor wafer or a glass plate for liquid crystal, but if a dust particle sticks to a photomask used in this stage, the dust particle obstructs the ultraviolet light or reflects it, causing deformation, short circuit or the like in the pattern being transferred, and such phenomena lead to lowering of the quality of the end products.

Thus, these works are usually performed in a clean room, but, even in a clean room, it is yet difficult to keep the photomask clean all the time. Hence, the exposure light irradiation is conducted only after a surface of the photomask is sheltered by a pellicle as a dust fender. Under such circumstances, foreign particles do not directly adhere to the surface of the photomask, but only onto the pellicle membrane, and thus by setting a photo focus at a pattern on the photomask at the time of lithographing, the foreign particles on the pellicle membrane fail to transfer their shadows onto the photomask.

In general, a pellicle is built up of a pellicle frame, which is made of aluminum, a stainless steel, an engineering plastic or the like, and a transparent pellicle membrane usually made of cellulose nitrate, cellulose acetate, a fluorine-containing polymer or the like which transmit light well; this pellicle membrane is adhered to an upper one of the two annular faces of the pellicle frame. On a lower one of the annular faces of the frame is laid an agglutinant layer made of a polybutene resin, a polyvinyl acetate resin, an acrylic resin, a silicone resin or the like for attaching the pellicle frame to the photomask, and over this agglutinant layer is laid a releasable liner (separator) for protecting the agglutinant layer.

In recent years, owing to the increased refinement of the exposure light pattern, the problem of the deformation of the photomask caused when the pellicle is adhered to it has become more focused. This problem occurs as the photomask and pellicle frame are coupled together via the agglutinant layer, whereby the form of the pellicle frame affects that of the photomask, and thus the pattern described on the surface of the photomask is deformed from the original form; hence, a pellicle is called for that scarcely affects the shape of the photomask when it is attached thereto.

Various countermeasures have been proposed to solve this problem: for example, the mask-boding agglutinant layer is made softer, or the flatness of the pellicle frame is improved. There proposed methods can reduce the influence which the pellicle frame shape imparts to the photomask shape, but the result is not necessarily sufficient. This is on account of the fact that the flatness of the pellicle frame and that of the photomask are not necessarily perfect and, depending on the individual combinations of them the magnitude of the influence imparted by the pellicle frame shape to the photomask shape is irregular.

As is learnt from IP Publications 1 through 3, the conventional countermeasures proposed are basically designed to reduce the rigidity of the pellicle frame so as to enable the pellicle frame to readily fit and copy the shape of the photomask, through a use of a material of low rigidity such as resin or by lowering the height of the pellicle frame or modifying the cross section of the frame bar thereby reducing the cross sectional area.

PRIOR ART PUBLICATIONS

IP Publications

[IP Publication 1]
    Japanese Patent Application Publication No. 2011-7933
[IP Publication 2]
    Japanese Patent Application Publication No. 2011-7934
[IP Publication 3]
    Japanese Patent Application Publication No. 2011-7935

SUMMARY OF THE INVENTION

Problems the Invention Seeks to Solve

However, in the actual manufacturing scenes, for the reason of the necessity of maintaining the pellicle frame free of deformation so as to maintain the pellicle membrane tensed and free of wrinkles during the stages from manufacturing through adhesion to a photomask, the pellicle frame is preferably made as rigid as possible; for this reason to reduce its rigidity excessively is not acceptable on account of the problems it would cause in the manufacturing and the handling of the pellicle. Therefore, this solution of reducing the rigidity of the pellicle frame faces a dilemma.

Also, although to reduce the height of the pellicle frame is an effective maneuver to improve the ability of the frame to readily fit and copy the shape of the photomask, the problem of the maneuver is that the distance between the pellicle membrane and the photomask (stand-off) becomes so small that enough defocusing effect, which is the very purpose of the pellicle, is not obtained. As for the solution of reducing the cross sectional area of the frame bar to thereby reduce the rigidity of the frame, if, for example, the inner wall of the pellicle frame is made to have a groove or the like, such niches would liable to become a source of foreign materials.

Consequently, the pellicle that is currently called for in particular is such one that has a frame which can maintain a suitable frame rigidity while giving rise to little problem during their manufacturing and service times, and which can maintain as high a stand-off as possible, and one which induces scarce deformation in the photomask during its adhesion thereto.

Hence, in view of the above-described circumstances, it is an object of the present invention to provide a pellicle with a frame which induces only very small deformation to the photomask as it is adhered thereto, so as to suppress the deformation of the photomask.

The present inventor worked hard to attain this object, and found that when the mask-bonding agglutinant layer is laid continuously (endlessly) on the lower annular face of the pellicle frame the bias imparted by the pellicle frame to the photomask via the agglutinant layer becomes maximized owing to the maximized area of the agglutinant layer, whereby the photomask undergoes an extensive deformation as the pellicle frame is adhered to it. So the inventor studied further, and realized that if the mask-bonding agglutinant layer is laid intermittently on the annular face of the pellicle frame and if the spaces (vacancies) thus created are filled entirely with a non-adhesive resilient material, then the bias imparted to the photomask becomes smaller than when the mask-bonding agglutinant layer is laid continuously so that the pellicle induced deformation of the photomask can be substantially suppressed—hence the possession of the invention.

Means to Solve the Problem

In particular, the pellicle of the present invention includes a rectangular pellicle frame having long side bars and short side bars, and the invented pellicle is characteristic in that its mask-bonding agglutinant layer is divided into at least two segments and the spaces between the segments of the agglutinant layer are entirely filled with a non-agglutinant resin. It is preferable that at least one segment of the agglutinant layer exists on both of the long side bars or on both of the short side bars or on any one of the side bars.

It is also preferable that some segments of the mask-bonding agglutinant layer are each laid on an area of the annular face of the pellicle frame which includes a corner; it is possible that the segments of the mask-bonding agglutinant layer are laid only on side bars so that they do not reach corners and thus straight. It is preferable that the total of the lengths of the segments of the mask-bonding agglutinant layer as measured along the inner wall of the pellicle frame is 10 through 70% of an inner circumference of the pellicle frame (inner wall length).

It is further preferable that the exposed face of the mask-bonding agglutinant layer (segments) is processed to have a flatness of 30 micrometers or smaller, and that the difference between the maximum thickness and the minimum thickness of each segment of the agglutinant layer is 0.1 mm or smaller.

Similarly, the exposed face of the resilient material layer is preferably processed to have a flatness of 30 micrometers or smaller and is preferably flush with the surface of the mask-bonding agglutinant layer; the hardness of the resilient body layer is preferably 50 or lower in terms of durometer hardness A; the material of the resilient body layer can be selected from an SBS (styrene butadiene styrene-block copolymer) resin, an SEBS (styrene ethylene-butylene styrene block copolymer) resin, an SEPS (styrene ethylene-propylene styrene block copolymer) resin, a fluorine-containing resin, a silicone resin, and a fluorine-modified silicone resin.

Effect of the Invention

According to the present invention, the mask-bonding agglutinant layer is divided into at least two segments and each space thus created between the segments is filled entirely with a non-adhesive resilient body layer so that the bonding power between the pellicle frame and the photomask would be moderated and thus the bias imparted to the photomask by the pellicle frame becomes smaller than when the mask-bonding agglutinant layer is laid continuously all around the pellicle frame, and accordingly there occurs an effect of substantial decrease in deformation of the photomask induced by the pellicle adhesion.

EXAMPLES TO EMBODY THE INVENTION

Here an example of embodying the present invention is explained in detail with reference to drawings, and one should not construe the invention to be limited thereto.

The pellicle of the present invention is particularly effective when used in a manufacture of semiconductor devices where the deformation of the photomask is particularly detested; but the present invention is not limited to a particular application. For example, besides the application in the pellicle used in semiconductor manufacturing line which has a side length of about 150 mm, the present invention is also applicable to larger pellicles such as ones having a side length of 200-300 mm for print substrate and ones having a side length of from about 500 mm to almost 2000 mm for liquid crystal panel and organic EL display panel; in fact the present invention can work for any pellicle where deformation of the photomask is caused as the pellicle is adhered to the photomask.

Figure 1:
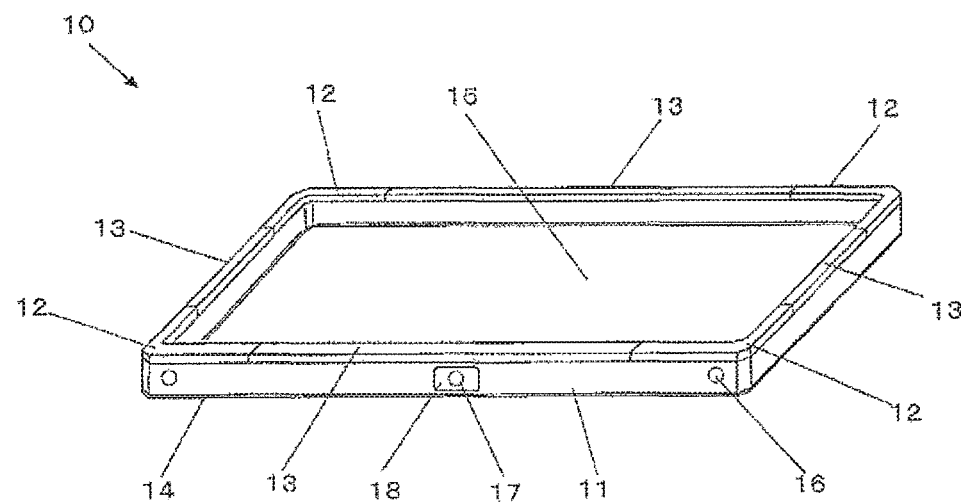
FIG. 1 A perspective view showing an embodiment of a pellicle of the present invention.

FIG. 1 is a perspective view of a pellicle 10, which is an embodiment of the present invention, as viewed from the side where a mask-bonding agglutinant layer 12 exists. Usually a protective separator is attached to the surface of the mask-bonding agglutinant layer 12, but the separator is not shown in FIG. 1.

In the embodiment of FIG. 1, four segments of the mask-bonding agglutinant layer 12 are each laid in an area including a corner of the rectangular pellicle frame 11, where a respective long side bar and a respective short side bar meet each other, and the respective space between the segments of the mask-bonding agglutinant layer 12 is entirely filled with a resilient body layer 13.

As for the manner of laying the mask-bonding agglutinant layer 12, there can be various choices besides the example of FIG. 1; for example, it is possible to lay segments of the mask-bonding agglutinant layer 12 only on the long side bars of the pellicle frame 11 or only on the short side bars thereof, or on all of the side bars.

Figure 2:
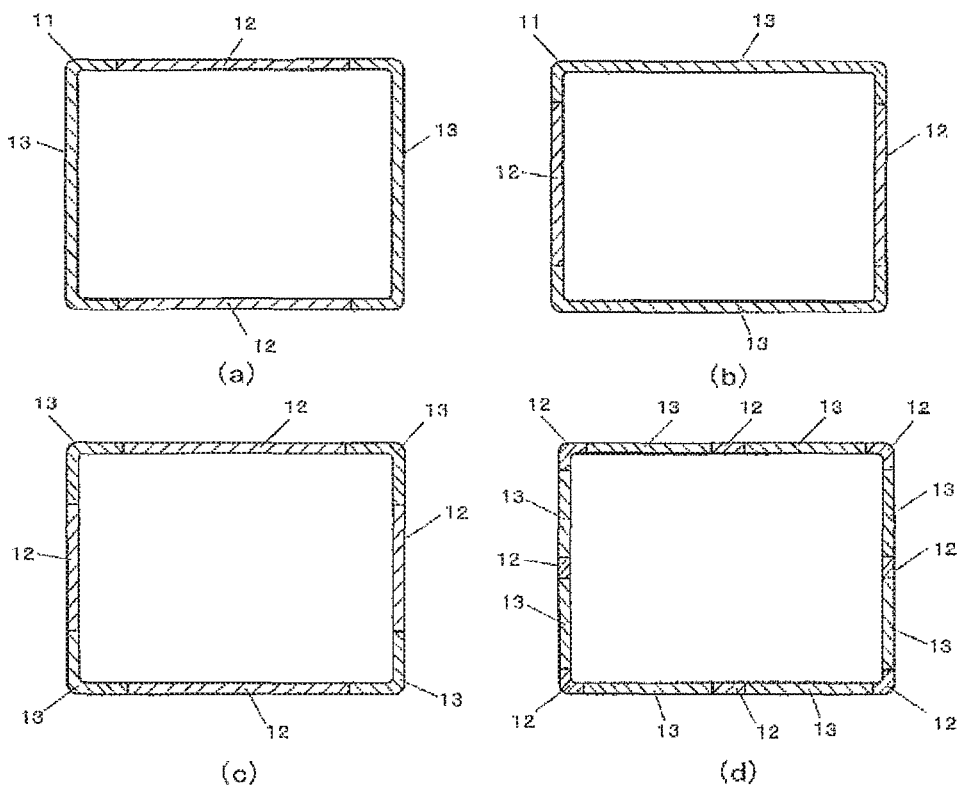
FIG. 2 A plan view showing an embodiment of a pellicle of the present invention.

FIG. 2 shows examples in which different manners of arranging the segments are shown. FIG. 2 (a) shows an example in which two segments of the mask-bonding agglutinant layer 12 are placed, one on a long side bar and the other on the opposite long side bar, and FIG. 2 (b) shows an example in which two segments of the mask-bonding agglutinant layer 12 are placed, one on a short side bar and the other on the opposite short side bar. In these examples it is seen that pieces of the non-adhesive resilient body layer 13 are filling entirely the respective spaces formed between the ends of the segments of the mask-bonding agglutinant layer 12.

FIG. 2 (c) shows an example in which four segments of the mask-bonding agglutinant layer 12 are placed, each one on each one of the four side bars in a manner such that the center of each segment coincides with the center of the respective side bar, and it is seen that segments of the non-adhesive resilient body layer 13 are filling entirely the respective spaces formed between the ends of the segments of the mask-bonding agglutinant layer 12. The next example shown in FIG. 2 (d) is such that eight segments of the mask-bonding agglutinant layer 12 are placed, four occupying the center area of respective one of the four side bars and the other four occupying the four corner areas of the pellicle frame 12, and it is seen that segments of the non-adhesive resilient body layer 13 are filling entirely the respective spaces formed between the ends of the segments of the mask-bonding agglutinant layer 12.

In the cases where the segments of mask-bonding agglutinant layer 12 are arranged on both of a pair of opposite side bars, long bars and/or short bars, it is preferable that the segments are arranged point-symmetrically about the center point of the rectangular pellicle frame, for the reason that the bonding force of the agglutinant layer 12 that binds the pellicle frame to the photomask is preferably distributed in a balanced manner.

In the cases of FIG. 1 and FIG. 2 (*d*), the segments of the mask-bonding agglutinant layer 12 are so arranged that the agglutinant layer 12 occupies the four corner areas of the pellicle frame 11, so that it is possible not only to reduce the influence of the pellicle imparted to the photomask, but also to maintain the reliability of the adhesion of the pellicle since the corners are where peeling of the mask-bonding agglutinant layer 12 and thus the detachment of the pellicle 10 most often originate. The examples of FIG. 1 and FIG. 2 (*d*), in which the mask-bonding agglutinant layer 12 occupies at least the four corner areas of the pellicle frame are especially effective in cases of large-sized photomasks and pellicles wherein the self-weight deformation of the photomask tends to be large as it is set horizontally in an exposure apparatus.

Also, in cases of large-sized pellicles wherein the pellicle frame has side bars exceeding 500 mm in length, the self-weight deformation of the pellicle frame 11 itself becomes so large that it is preferable to provide a segment of the agglutinant layer 12 in the middle part of each side bar, as shown in FIG. 2 (*d*), so as to prevent formation of a gap between the non-adhesive resilient body layer 13 and the photomask attributable to the self-weight deformation of the pellicle. In the example of FIG. 2 (*d*), the mask-bonding agglutinant layer 12 occupies the center area of every side bar as well as every corner area of the pellicle frame 11.

The number and positions of the segments of the mask-bonding agglutinant layer 12 can be determined arbitrarily based on the circumstances, and are not regulated, and can be otherwise than the above examples. However, in order to apply a balanced (impartial) distribution of the bonding force of the mask-bonding agglutinant layer 12 to the photomask, it is preferable to arrange such that at least one segment of the agglutinant layer 12 exists on both of the long side bars or on both of the short side bars. Also, as shown in FIG. 2, it is preferable that, whether the segments of the agglutinant layer 12 are distributed on the long side bars or short side bars, the segments are arranged point-symmetrically about the center point of the rectangular pellicle frame.

The examples of FIGS. 2 (*a*), (*b*) and (*c*) are cases wherein the mask-bonding agglutinant layer 12 occupy only the straight-line areas of the side bars of the pellicle frame 11 not including the corners. This type of arrangement is not particularly appropriate in the case of a large-sized photomask or pellicle, wherein the corners of the pellicle frame 11 are more capable of detaching from the photomask owing to the self-weight deformation of the photomask; however, in the case of small-sized photomask having a side length of 200 mm or smaller, which are common for semiconductor-related applications, the above-described type of arrangement is not inappropriate, for there is little problem of the self-weight deformation of the photomask.

In the examples shown in FIG. 2 (*a*) and FIG. 2 (*b*), the pellicle frame 11 has only two segments of the mask-bonding agglutinant layer 12, one on each side bar of a pair of opposing long side bars or short side bars, so that the number of joints connecting the segments of the mask-bonding agglutinant layer 12 and the segments of the resilient layer 13 are small, and therefore the advantages of these examples are it is easier to manufacture the pellicle and to obtain higher flatness.

In the example shown in FIG. 2 (*c*), every side bar of the pellicle frame 11 has one segment of the mask-bonding agglutinant layer 12 so that there are four segments in all, and this example is suitable in cases where it is necessary to secure a large area of the mask-bonding agglutinant layer 12.

The area that the mask-bonding agglutinant layer 12 should occupy on the pellicle frame ought to be large enough to provide a bonding power that overcomes the self-weight influence of the pellicle 10 for an extensive period of time, so that the area shall be determined in consideration of the bonding strength of the agglutinant material used for the mask-bonding. In other words, the greater the bonding strength of the agglutinant used is, the smaller the area of the mask-bonding agglutinant layer 12 may be, and the smaller the bonding strength of the agglutinant used is, the larger the area of the mask-bonding agglutinant layer 12 should be.

Irrespective of the manner of the arrangement of the segments of the agglutinant layer 12, it is preferable that the total of the lengths of the segments as measured along the inner wall of the pellicle frame is 10 through 70% of the inner circumference of the pellicle frame (including the curved corners thereof).

If the total of the lengths of the segments is less than 10%, there occurs a fear that the bonding strength becomes so weak that the pellicle might hang down or fall from the photomask; on the contrary, if the total length exceeds 70%, then the bonding strength between the photomask and the pellicle frame 11 might become too great to attain the desired effect of the invention.

This mask-bonding agglutinant layer 12 may be made of any known agglutinant material, such as a rubber resin, a urethane resin, an acrylic resin, a SEBS resin, a SEPS resin, or a silicone resin.

In order to secure the stability of the photomask after it is adhered to the pellicle and also to further mitigate the influence of the pellicle 10 imparted to the photomask, it is preferable that the exposed face of the mask-bonding agglutinant layer (segments) 12 is processed to have a flatness of 30 micrometers or smaller, and that the difference between the maximum thickness (height) and the minimum thickness of each segment of the agglutinant layer is 0.1 mm or smaller.

Segments of the resilient body layer 13 are arranged to fill all the spaces between the ends of the segments of the mask-bonding agglutinant layer 12. This resilient body layer 13 does not possess adhesiveness so that if there is a roughness in an end face of a segment of the agglutinant layer 12 and/or in an end face of a segment of the resilient body layer 13 which are joining each other, then there occurs an air pass through the joint whereby the inside space of the pellicle fails to be sealed from the outside space; consequently it is preferable to make the layers 12 and 13 in a manner such that their end faces are perfectly flat.

Also, similarly as the mask-bonding agglutinant layer 12, the exposed face of the resilient body layer 13 is preferably processed to have a flatness of 30 micrometers or smaller, and is preferably flush with the surface of the mask-bonding agglutinant layer; the hardness of the resilient body layer 13 is preferably 50 or lower in terms of durometer hardness A, because thereby the resiliency after the adhesion is mitigated and thus the influence imparted to the photomask is reduced and also the adhesiveness to the photomask is improved pushing up the reliability.

The material of the resilient body layer 13 can be selected from an SBS resin, an SEBS resin, an SEPS resin, a fluorine-containing resin, a silicone resin, and a fluorine-modified silicone resin. Thermosetting resins such as SBS resin, SEBS resin, and SEPS resin are preferable because they have advantages such as good workability and high affinity to combine with other adhesive materials.

Fluorine-containing resin, silicone resin, and fluorine-modified silicone resin are advantageous in that they have excellent light resistance. If gel-type silicone resin or gel-type fluorine-modified silicone resin is selected, especially one that has a penetration of 50 or greater, the influence imparted to the photomask is substantially mitigated due to the softness of the thus made resilient body layer.

Considerations that ought to be made in selecting the materials to make the mask-bonding agglutinant layer 12 and the resilient body layer 13 include that the mask-bonding agglutinant layer has sufficient bonding strength relative to the weight of the pellicle frame 11 and that mask-bonding agglutinant layer 12 and the resilient body layer 13 have affinity to each other so as to allow a formation of a fine joint between them.

The procedure of applying the mask-bonding agglutinant layer 12 and the resilient body layer 13 can be arbitrarily determined based on the materials used. For example, in a case wherein the mask-bonding agglutinant layer 12 is made of an acrylic agglutinant and the resilient body layer 13 is made of an SEPS resin, firstly the mask-bonding agglutinant layer 12 made of the acrylic agglutinant are applied in segments to predetermined parts of the pellicle frame 11 and the segments receive a flattening treatment and are rid of the solvent by drying and also they are cured. Thereafter, the resilient body layer 13 made of the SEPS resin is applied, while being kept at high temperature, to the unoccupied parts of the pellicle frame 11; then the thus applied segments of the resilient body layer 13 receive a flattening treatment while being heated, and thereby the resilient body layer 13 and the mask-bonding agglutinant layer 12 become flush with each other.

In another example wherein the mask-bonding agglutinant layer 12 is made of a silicone agglutinant and the resilient body layer 13 is made of a fluorine-modified silicone resin, firstly the mask-bonding agglutinant layer 12 made of the silicone agglutinant are applied in segments to predetermined parts of the pellicle frame 11 and the segments are rid of the solvent by drying until the fluidity of the segments is lost. Thereafter, the resilient body layer 13 made of the fluorine-modified silicone resin is applied to the unoccupied parts of the pellicle frame 11; then, the thus applied segments of the resilient body layer 13 and the segments of the mask-bonding agglutinant layer 12 receive a flattening treatment at once. Then, the layers 12, 13 are heated to become completely free of the solvents whereby the hardened mask-bonding agglutinant layer and the hardened resilient body layer 13 are completed at the same time.

The pellicle frame 11 may be made of any conventionally used materials including metals such as an aluminum alloy, a steel, a stainless steel, and brass, or engineering plastics such as PE, PA and PEEK, or fiber composites such as GFRP and CFRP. It is preferable that the surface of the frame is treated to have a black color, and if need be, a surface treatment such as coating is applied so as to prevent creation of dust from the surface. For example, in a case wherein an aluminum alloy is used, it is preferable to apply a surface treatment such as alumite treatment or chemical conversion treatment, and in a case wherein steel, stainless steel or the like is used, it is preferable to apply a surface treatment such as black chrome plating.

In the case of the embodiment of FIG. 1, the cross section of the side bar of the pellicle frame 11 is rectangular, as is generally the case, but it is possible to make chamfers along the edge lines of the pellicle frame 11 or make grooves in the side faces thereof so as to reduce the cross section whereby the rigidity of the pellicle frame 11 is reduced and the influence imparted to the photomask is minimized.

Usually, a separator (not shown), which consists of a 50-300-micrometer-thick film of PET or the like and a releasing agent coated on one side of the film, is applied to the surface of the agglutinant layer 12 for the protection thereof however, it is preferable if the separator is omitted by adopting a specially designed pellicle container or using a special pellicle support means, or the like.

It is also preferable that the inner wall face a of the pellicle frame 11 is coated with an adhesive material (not shown in Figs) such as an acrylic resin adhesive or a silicone resin adhesive so as to capture and fix floating foreign particles. It is preferable too to provide a coating of a non-adhesive material (not shown either) such as an acrylic resin or a fluorine-containing resin on the inner wall face only or on the entire surface of the pellicle frame so as to prevent falling of foreign particles from the frame. The formation of the layers of these adhesive resin and non-adhesive resin may be performed by a conventionally used method such as spraying, dipping, powder coating or electro-deposition coating.

For the purpose of handling or the like, the outer face of the pellicle frame 11 may be formed with such means as jig holes 16, as shown in FIG. 1, or grooves (not shown); it is also preferable to give markings such as model No., serial No. or bar code (none of these shown) to the frame by means of mechanical engraving or laser marking.

Also, in order for the adjustment of the air pressure inside the pellicle 10 after its adhesion to the photomask, it is good to make a vent hole 17 through a pellicle frame bar, and for the purpose of preventing foreign particles from entering the pellicle's inside space, a porous film filter 18 made of PTFE or the like may be attached to cover the outer port of the vent hole 17. The attaching of the filter 18 may be done by first applying an adhesive layer of an appropriate material to the outer wall face of the pellicle frame 11 in the vicinity of the vent hole 17 and fixing the filter 18 to the frame via the adhesive. The locations, the numbers and the shapes of the vent hole 17 and the filter 18 may be determined after taking into consideration the required ventilation degree and the convenience in handling.

The material for the pellicle membrane 15 may be selected from cellulose type resins, fluorine-containing resins, and the like depending on the kind of the exposure light source used, and the membrane thickness is to be selected from the range of 0.1-10 micrometers in view of the transmittance, mechanical strength, etc., and it is possible to apply an antireflection layer if need be. The pellicle membrane-bonding adhesive layer 14 may be made of a conventionally used adhesive material such as an acrylic adhesive, a fluorine-containing adhesive, a silicone adhesive or the like.

In the present invention, the mask-bonding agglutinant layer 12 consists of at least two segments arranged on the pellicle frame 11, and each space formed between the ends of these segments is filled with a segment of resilient body layer made of a non-adhesive resin so that the bonding power between the pellicle frame and the photomask would be moderated and thus the bias imparted to the photomask by the pellicle frame becomes smaller than when the mask-bonding agglutinant layer is laid endlessly all around the pellicle frame. Accordingly, the influence of the shape of the pellicle frame 11 imparted to the photomask can be reduced and as a result the deformation of the photomask that takes place during the adhesion of the pellicle 10 is substantially suppressed.

Each space formed between the segments of the mask-bonding agglutinant layer 12, where the mask-bonding agglutinant layer 12 is not formed, is filled with a segment of the resilient body layer 13, which is non-adhesive and has elasticity, in a manner such that the resilient body layer 13 and the mask-bonding agglutinant layer 12 are flush with each other, and furthermore, the resilient body layer 13 is capable of leaklessly attaching to the photomask surface so that the space between the photomask and the pellicle is sealed with the result that not only the influence of the pellicle frame 11 imparted to the shape of the photomask is reduced but also the entrance of foreign particles into the inner space of the pellicle 10 is prevented.

According to the present invention, there is no need for decreasing the height of the pellicle frame 11 to thereby decrease the rigidity thereof for the purpose of increasing the capacity of the pellicle frame 11 to fit and copy the shape of the photomask, so that it is possible to maintain the capability of defocusing a foreign particle at high levels.

EXAMPLES

Example 1

Now, examples of the present invention will be explained, and in Example 1 a pellicle 10, of which a perspective view is shown in FIG. 1, was made in the following manner.

A pellicle frame 11 was cut out by machining from a body of aluminum alloy A5052 to have an external dimension of 149 mm×113 mm, an internal dimension of 145 mm×109 mm, and a height of 4.7 mm, and the corners were rounded to have a contour of a 3-mm-radius quarter circle inside and a 5-mm-radius quarter circle outside.

Also, in the middle part of a longer bar of the pellicle frame 11 is formed a penetrating vent hole 17 having a diameter of 0.5 mm; and in the vicinity of each frame corner non-penetrating jig holes 16 for pellicle handling having a diameter of 1.6 mm and a depth of 1.2 mm are formed at either end of the bars. All around the pellicle frame the edge lines were chamfered by C:0.2 mm or so (not shown); the entire surface of the pellicle frame was roughened to Ra=0.6 or so by applying sand blasting, and then the surface was subjected to black color alumite treatment.

The thus treated pellicle frame 11 was thoroughly washed with a surface-active agent and pure water, and then dried. Then, as shown in the example of FIG. 1, a silicone agglutinant (KR3700, a product name of Shin-Etsu Chemical Co., Ltd.) as the mask-bonding agglutinant was laid on the agglutinant-side annular face of the pellicle frame 11 at the four corner areas including end parts of the long bars and short bars, by means of an air pressure type dispenser mounted on an orthogonal tri-axial robot.

On this occasion each segment of the mask-bonding agglutinant layer 12 extends 20 mm from the corner both in the directions of the long side bar and the short side bar, and the total length of the four segments of the mask-bonding agglutinant layer 12 as measured along the inner wall of the pellicle frame 11 was 154.84 mm. The length of the inner wall of the pellicle frame 11 was 502.84 mm, so that the total length of the four segments 12 as measured along the inner wall of the pellicle frame 11 accounted for about 30.8% of the length of the inner wall of the pellicle frame 11.

Then, the thus applied mask-bonding agglutinant layer 12 was let to sit in an air flow for 1.5 hours to dry; thus the solvent was naturally eliminated. Next, a fluorine-modified silicone resin (SIFEL, a product name of Shin-Etsu Chemical Co., Ltd.) as the resilient body layer 13 was applied to those areas of the agglutinant-side annular face of the pellicle frame 11 where no agglutinant layer 12 had been applied by means of an air pressure type dispenser.

The mask-bonding agglutinant layer 12 and the resilient body layer 13 were together pressed against a stainless steel flat plate having a flatness of 5 micrometers, with a separator PET sheet having a thickness of 125 micrometers and coated with a releasing agent interposed between them, to flatten them; then the mask-bonding agglutinant layer 12 and the resilient body layer 13 were half-cured by a heat of 110 degrees C. Thereafter, the separator sheet used for the flattening of the mask-bonding agglutinant layer 12 and the resilient body layer 13 was peeled off and the layers 12, 13 were completely cured by a heat of 150 degrees C., and the thus finished mask-bonding agglutinant layer 12 and the resilient body layer 13 were measured for their flatness and the result was found to be 20 micrometers.

Next, as the pellicle membrane-bonding adhesive a fluorine-containing resin (CYTOP, a product name of ASAHI GLASS CO., LTD.) was laid on an annular face of the pellicle frame 11, which is opposite the face on which the mask-bonding agglutinant layer 12 and the resilient body layer 13 were laid, by means of an air pressure type dispenser mounted on an orthogonal tri-axial robot; then the solvent of the adhesive was eliminated by drying and thus a pellicle membrane-bonding adhesive layer 14 was completed. Then, a porous film filter 18 made of PTFE was attached to cover the vent hole 17, which was in the middle of the long side bar, by means of an acrylic adhesive sheet.

In Example 1, a fluorine-containing resin (CYTOP, a product name of ASAHI GLASS CO., LTD.), as the material to make the pellicle membrane, was made into a membrane by spin coating method on a membrane-making plate (a 300-mm diameter silicon wafer), and after eliminating the solvent by drying, the membrane was transferred from the membrane-making plate to a temporary frame having the same external dimension as the membrane-making plate, by adhering the temporary frame to the membrane and peeling it from the plate; the thus peeled membrane had a thickness of 0.28 micrometer. This membrane was adhered by heat to the pellicle membrane-bonding adhesive layer 14 on the pellicle frame 11 to become the pellicle membrane 15, and the excessive part of the membrane which extended beyond the outer extremity of the pellicle frame 11 was trimmed off by a cutter whereby the pellicle 10 was completed.

Incidentally, in Example 1, a separator to protect the surfaces of the mask-bonding agglutinant layer 12 and the resilient layer 13 is omitted; but, when it is necessary it can be provided. In such a case, for example, one which consists of an about 100-200-micrometer-thick film of PET or the like and a releasing agent coated on one side of the film may be used, and the kind of this releasing agent ought to be determined depending on the kind of the agglutinant 12 used.

Subsequently, for the purpose of evaluation of this pellicle 10, a square photomask base plate made of quartz glass measuring 150 mm by 150 mm by 6 mm (thickness) and having a flatness of 0.30 micrometer was prepared, and to it the pellicle 10 was adhered. On this occasion, the pressure added to the pellicle to adhere to the photomask (base plate) was 5 kgf and the pressing time was 3 minutes.

After the adhesion of the pellicle 10 to the photomask, quality of the attachment of the mask-bonding agglutinant layer 12 and the resilient body layer 13 to the photomask was inspected by eye through the back side face of the photomask, and it was found that the attachment (contact) was made by a sufficient width all around the pellicle frame 11 so that the adhesion of the pellicle 10 to the photomask was of high quality.

Also the eight joints at which respective ends of the segments of the mask-bonding agglutinant layer 12 join with respective ends of the segments of the resilient body layer 13 were inspected by eye and it was found that, although there were slight irregularities in the width of the attachment among the joints, there were no air trap or substantial dwarfing in the width of the attachment or the like that may lead to a leakage between the inner space of the pellicle and the outer space. Then, the flatness of this photomask coupled with the pellicle was measured, and it was 0.31 micrometer as opposed to its pre-bonding flatness of 0.30 micrometer; thus it was confirmed that the flatness of the photomask changed only very slightly by the adhesion of the pellicle.

Example 2

In Example 2, using a pellicle frame 11, which was made in the same manner and size as in Example 1, a pellicle 10 was manufactured also through the same procedure as in Example 1. And in Example 2, the mask-bonding agglutinant layer 12 was arranged on the pellicle frame 11 in the pattern as shown in FIG. 2 (c) unlike the case of Example 1; in particular, a 100-mm-long segment of mask-bonding agglutinant layer 12 was formed centrally on each long side bar of the pellicle frame 11, and likewise a 60-mm-long segment was formed centrally on each short side bar, and then four spaces including the respective four corner areas that are formed between the ends of the four segments of the agglutinant layer 12 were filled up with four respective segments of the resilient body layer 13.

In Example 2, the total length of the four segments of the mask-bonding agglutinant layer 12 as measured along the inner wall of the pellicle frame 11 was 320 mm. The length of the inner wall of the pellicle frame 11 was 502.84 mm, so that the total length of the four segments 12 as measured along the inner wall of the pellicle frame 11 accounted for about 63.6% of the length of the inner wall of the pellicle frame 11. The mask-bonding agglutinant layer 12 and the resilient body layer 13 of the thus finished pellicle 10 were measured for their flatness, and the result was 20 micrometers.

In Example 2 also, for the purpose of evaluation of this pellicle 10, a square photomask made of quartz glass measuring 150 mm by 150 mm by 6 mm (thickness) and having a flatness of 0.28 micrometer was prepared, and to it the pellicle 10 was adhered in the same manner as in Example 1; then, the quality of the attachment of the mask-bonding agglutinant layer 12 and the resilient body layer 13 to the photomask was inspected by eye through the back side face of the photomask, and it was found that the attachment (contact) was made by a sufficient width all around the pellicle frame 11 so that the adhesion was of high quality.

Also the eight joints at which respective ends of the segments of the mask-bonding agglutinant layer 12 join with respective ends of the segments of the resilient body layer 13 were inspected by eye and it was found that the joints were all flawless. Then, the flatness of the photomask coupled with the pellicle 10 was measured, and it was 0.31 micrometer as opposed to its pre-bonding flatness of 0.29 micrometer. Thus it was confirmed that the flatness of the photomask changed only very slightly by the adhesion of the pellicle 10.

Comparative Example

In a comparative example, using a pellicle frame 11, which was made in the same manner and size as in Examples 1 and 2, a pellicle 10 was manufactured also through the same procedure as in the Examples; however in this comparative example, the mask-bonding agglutinant layer 12 was formed endlessly on the entire circuit of the pellicle frame 11, so that no resilient body layer 13 was used unlike Example 1 and Example 2. Using only the mask-bonding agglutinant layer 12 throughout the mask-side annular face of the pellicle frame, this comparative example differs from Examples 1 and 2 most significantly in that no resilient body layer 13 was in existence. The thus finished mask-bonding agglutinant layer 12 was measured for its flatness and the result was 20 micrometers, same as in Examples 1 and 2.

In the same manner as in Examples 1 and 2, the pellicle 10 was adhered to a photomask, and the quality of the adhesion of the mask-bonding agglutinant layer 12 was inspected by eye through the back side face of the photomask, and it was found that the adhesion was made by a uniform width all around the pellicle frame 11 so that the adhesion was evaluated to be of high quality. Then, the flatness of the photomask coupled with the pellicle 10 was measured, and it was 0.36 micrometer as opposed to its pre-bonding flatness of 0.30 micrometer. Incidentally, the size and the flatness of the photomask used in this comparative example were equivalent to the ones used in Examples 1 and 2, namely its size was 150 mm by 150 mm by 6 mm (thickness) and its flatness was 0.30 micrometer.

Thus, in this comparative example it was found that the flatness of the photomask changed significantly by the adhesion of the pellicle 10, as compared with 0.3 micrometer in the cases of Examples 1 and 2.

REPRESENTATION OF REFERENCE NUMERALS

10: pellicle
11: pellicle frame
12: mask-bonding agglutinant layer
13: resilient body layer
14: pellicle membrane-bonding adhesive layer
15: pellicle membrane
16: jig hole
17: vent hole
18: filter Scopes of what is claimed:

1. A pellicle comprising a rectangular pellicle frame having long side bars and short side bars, a pellicle membrane adhered to one annular face of said pellicle frame via an adhesive, and a mask-bonding agglutinant layer adhered to the other annular face of said pellicle frame, wherein said mask-bonding agglutinant layer is divided into at least two segments and that segments of a non-resilient body layer are adhered to said other annular face of the pellicle frame in a manner such that all spaces created between said segments of the mask-bonding agglutinant layer are entirely filled by said segments of the non-resilient body layer.

2. The pellicle as claimed in claim 1, wherein said segments of the mask-bonding agglutinant layer are arranged in a manner such that they are on both of short side bars, or on both of long side bars, or on all the side bars.

3. The pellicle as claimed in claim 1, wherein some segments of said mask-bonding agglutinant layer are each laid on an area which includes a corner of the pellicle frame.

4. The pellicle as claimed in claim 1, wherein said segments of the mask-bonding agglutinant layer are only on side bars and are straight.

5. The pellicle as claimed in claim 1, wherein a total of lengths of said segments of the mask-bonding agglutinant layer as measured along an inner wall of the pellicle frame is 10 through 70% of length of said inner wall.

6. The pellicle as claimed in claim 1, wherein exposed faces of said segments of the mask-bonding agglutinant layer have a flatness of 30 micrometers or smaller.

7. The pellicle as claimed in claim 1, wherein a difference between maximum thickness and minimum thickness of each segment of the mask-bonding agglutinant layer is 0.1 mm or smaller.

8. The pellicle as claimed in claim 1, wherein exposed faces of said segments of the resilient material layer have a flatness of 30 micrometers or smaller, and are flush with the exposed face of the mask-bonding agglutinant layer.

9. The pellicle as claimed in claim 1, wherein a hardness of said resilient body layer is 50 or lower in terms of durometer hardness A.

10. The pellicle as claimed in claim 1, wherein said resilient body layer is made of a material selected from an SBS resin, an SEBS resin, an SEPS resin, a fluorine-containing resin, a silicone resin, and a fluorine-modified silicone resin.

11. The pellicle as claimed in claim 1, wherein said segments of the mask-bonding agglutinant layer are arranged point-symmetrically about the center point of the rectangular pellicle frame.

12. The pellicle as claimed in claim 2, wherein some segments of said mask-bonding agglutinant layer are each laid on an area which includes a corner of the pellicle frame.

13. The pellicle as claimed in claim 2, wherein said segments of the mask-bonding agglutinant layer are only on side bars and are straight.

* * * * *